(12) United States Patent
Cassia et al.

(10) Patent No.: US 9,602,130 B2
(45) Date of Patent: Mar. 21, 2017

(54) SYSTEM AND METHOD FOR MATCHING A REGULAR EXPRESSION OR COMBINATION OF CHARACTERS

(71) Applicant: NGD SYSTEMS, INC., Irvine, CA (US)

(72) Inventors: Ricardo Cassia, Rancho Santa Margarita, CA (US); Joao Alcantara, Irvine, CA (US); Kamyar Souri, San Jose, CA (US)

(73) Assignee: NGD Systems, Inc., Irvine, CA (US)

( * ) Notice: Subject to any disclaimer, the term of this patent is extended or adjusted under 35 U.S.C. 154(b) by 0 days.

(21) Appl. No.: 15/242,359

(22) Filed: Aug. 19, 2016

(65) Prior Publication Data

US 2016/0359501 A1    Dec. 8, 2016

Related U.S. Application Data

(63) Continuation-in-part of application No. 14/816,964, filed on Aug. 3, 2015, now abandoned.

(60) Provisional application No. 62/034,066, filed on Aug. 6, 2014.

(51) Int. Cl.
   *H03M 7/34* (2006.01)
   *H03M 7/30* (2006.01)

(52) U.S. Cl.
   CPC ......... *H03M 7/705* (2013.01); *H03M 7/3084* (2013.01)

(58) Field of Classification Search
   CPC ............................ H03M 7/3084; H03M 7/705
   USPC .............................................. 341/51, 87, 106
   See application file for complete search history.

(56) References Cited

U.S. PATENT DOCUMENTS

| | | | |
|---|---|---|---|
| 6,906,644 B2 * | 6/2005 | Satoh | H03M 7/40 341/51 |
| 7,215,259 B2 * | 5/2007 | Kerber | H03M 7/3084 341/106 |

* cited by examiner

*Primary Examiner* — Khai M Nguyen
(74) *Attorney, Agent, or Firm* — Lewis Roca Rothgerber Christie LLP

(57) ABSTRACT

A system and method for comparing a character from a search space simultaneously to each of a set of search characters. The set of search characters may correspond to a regular expression. In one embodiment, the search space character is encoded to a short binary presentation (e.g., to an 8-bit representation), which is then converted to a long binary representation one bit of which is set, at a first position in the long binary representation corresponding to the value of the short representation. Each character of the set of search characters is similarly encoded and converted to a respective long binary representation. If the bit in one of the long binary representations corresponding to the set of search characters is set, it indicates that the search character matches the corresponding character of the set of search characters.

21 Claims, 5 Drawing Sheets

SYSTEM AND METHOD FOR MATCHING A REGULAR EXPRESSION OR COMBINATION OF CHARACTERS

CROSS-REFERENCE TO RELATED APPLICATION(S)

The present application is a continuation-in-part of U.S. patent application Ser. No. 14/816,964, filed Aug. 3, 2015, entitled "SYSTEM AND METHOD TO CONCURRENTLY MATCH ANY TYPE, COMBINATION AND/OR RANGE OF CHARACTERS DEFINED BY A REGULAR EXPRESSION ON A HARDWARE IMPLENTATION USING A SINGLE DETECTION LOGIC", which claims priority to and the benefit of U.S. Provisional Application No. 62/034,066, filed Aug. 6, 2014, entitled "SYSTEM AND METHOD TO CONCURRENTLY MATCH ANY TYPE, COMBINATION AND/OR RANGE OF CHARACTERS DEFINED BY A REGULAR EXPRESSION ON A HARDWARE IMPLEMENTATION USING A SINGLE DETECTION LOGIC", the entire contents of both of which are incorporated herein by reference.

FIELD

One or more aspects of embodiments according to the present invention relate to searching, and more particularly to a system and method for determining whether a character from a search space is the same as any one of a set of search characters.

BACKGROUND

In various data processing operations it may be useful to determine whether a set of data (referred to herein as the search space) including a plurality of characters contains a string matching a search pattern string. For example, a user may wish to search a document, or a plurality of documents, or a database, to determine whether it contains a particular word, or in how many places it contains the word. In some cases, it may be useful to search for occurrences of strings matching a regular expression, which may, for example, define a family of words. For example, the regular expression "[Hh]otel" would match both "Hotel" and "hotel", and a user could use a search with this regular expression to count the number of times the word "hotel" occurs in a document, whether at the beginning of a sentence (in which case it would be written "Hotel") or in the middle of a sentence (in which case it would be written "hotel").

Performing searches for multiple characters may be computationally costly. For example, when a character is received from the search space, determining whether it is either "H" or "h" may involve, in a microprocessor, executing two compare operations, one after the other, or, in hardware, implementing two comparators (e.g., 8-bit comparators). If a larger number of possibilities are to be tested, the determination may become correspondingly more costly. For example, to determine whether a character is an upper case or lower case consonant may require 40 compare operations in a microprocessor, or an array of 40 comparators (if "y" is considered not to be a consonant). Some hardware implementations for comparing a string from a search space to a regular expression may use multiple single character comparators assisted by range comparators in order to find a positive match of a particular search pattern; these approaches too may be costly.

Thus, there is a need for an efficient way to perform pattern matching.

SUMMARY

Aspects of embodiments of the present disclosure are directed toward a system and method for comparing a character from a search space concurrently or simultaneously to each of a set of search characters. The set of search characters may correspond to a regular expression. In one embodiment, the search space character is encoded to a short binary representation (e.g., to an 8-bit representation), which is then converted to a long binary representation one bit of which is set, at a first position in the long binary representation corresponding to the value of the short representation. The long binary representation may, for example, equal $2^s$, where S is the value of the short binary representation. Each character of the set of search characters is similarly encoded and converted to a respective long binary representation. If the bit at the first position in the long binary representation corresponding to one of the search characters is set, it indicates that the search space character matches the search character. The long binary representations corresponding to the set of search characters may be combined with a bit-wise OR to form a combined long binary representation. If the bit at the first position in the combined long binary representation is set, it indicates that the search space character matches one of the search characters.

According to an embodiment of the present invention there is provided a method for comparing a search space character to a set of search characters to determine whether the search space character matches any character in the set of search characters, the method including: converting a first short binary representation of the search space character into a first long binary representation, the first long binary representation having a first bit value in a first position within the first long binary representation; converting a short binary representation of a first search character of the set of search characters into a second long binary representation; and determining that the search space character matches the first search character when a bit in the first position of the second long binary representation has a second bit value.

In one embodiment, the first bit value is a value of binary 1 and the second bit value is a value of binary 1.

In one embodiment, the first long binary representation equals $2^{S1}$, wherein S1 is the value of the first short binary representation; and the second long binary representation equals $2^{S2}$, wherein S2 is the value of the short binary representation of the first search character of the set of search characters.

In one embodiment, the method includes: converting a short binary representation of a second search character of the set of search characters into a third long binary representation; and determining that the search space character matches either the first search character or the second search character when: a bit in the first position of the second long binary representation has the second bit value; or a bit in the first position of the third long binary representation has the second bit value.

In one embodiment, the method includes: converting a respective short binary representation of each search character of the set of search characters to form a corresponding set of respective long binary representations including the second long binary representation, the second long binary representation having the second bit value at a third position, each of the long binary representations of the set of respective long binary representations except the second long binary representation having a third bit value different from the second bit value; determining that the search space character matches one of the characters of the set of search characters when one of the long binary representations of the set of respective long binary representations has the second bit value at the first position; and determining that the search space character does not match one of the characters of the set of search characters when none of the set of respective long binary representations has the second bit value at the first position.

In one embodiment, the first short binary representation has a length of n bits, and the first long binary representation has a length of $2^n$ bits.

In one embodiment, the first short binary representation has a length of 8 bits, and the first long binary representation has a length of 256 bits.

In one embodiment, the method includes, before converting the first short binary representation of the search space character into the first long binary representation, encoding a search space character to form the first short binary representation of the search space character.

In one embodiment, the encoding of the search space character includes encoding the search space character with an American Standard Code for Information Interchange (ASCII) encoding.

In one embodiment, the converting of the first short binary representation of the search space character into a first long binary representation; the converting of the short binary representation of the first search character of the set of search characters into the second long binary representation; and the determining that the search space character matches the first search character when a bit in the first position of the second long binary representation has a second bit value, are performed in synchronous digital logic in one clock cycle.

According to an embodiment of the present invention there is provided a system including: a converter configured to receive, at an input of the converter, a first value of a short binary representation corresponding to a search space character, and to convert the short binary representation to a first long binary representation corresponding to the search space character, the first long binary representation having a bit at a first position set to a first bit value, the first position corresponding to the first value of the short binary representation, the converter being configured to generate a long binary representation having the bit at the first position set to the first bit value only when the value at the input of the converter is the first value of the short binary representation; a comparison circuit configured to receive at a first input the first long binary representation, and at a second input a second long binary representation, corresponding to a set of search characters, and to generate a binary output, the binary output having: a binary value indicating that the search space character matches a search character when a bit at the first position in the second long binary representation has a second bit value; and a binary value indicating that the search space character does not match a search character otherwise.

In one embodiment, the first bit value is a value of binary 1 and the second bit value is a value of binary 1.

In one embodiment, the comparison circuit includes a bit-wise AND gate having a first bus input, a second bus input, and a bus output, the bit-wise AND gate being configured to set to a value of binary 1 each bit of the bus output for which the corresponding bit at the first bus input has a value of binary 1 and the corresponding bit at the second bus input has a value of binary 1, and to set the remaining bits of the bus output to a value of binary 0.

In one embodiment, the first long binary representation has a length of m bits, m being a positive integer; the second long binary representation has a length of m bits; the first bus input of the bit-wise AND gate has a width of m bits; the second bus input of the bit-wise AND gate has a width of m bits; and the bus output of the bit-wise AND gate has a width of m bits.

In one embodiment, the system includes a unary OR gate having m inputs and one output, the m inputs of the unary OR gate being connected to respective bits of the bus output of the bit-wise AND gate, the unary OR gate being configured to set the output of the unary OR gate: to a value of binary 1 when at least one of the m inputs is set to a value of binary 1; and to a value of binary 1 when each of the m inputs is set to a value of binary 0.

In one embodiment, the short binary representation has a length of n bits, and $m=2^n$.

In one embodiment, the short binary representation has a length of 8 bits, and m=256.

In one embodiment, the system includes a processing circuit configured to: convert each of a plurality of short binary representations corresponding to respective search characters, to a corresponding long binary representation; and combine the long binary representations corresponding to respective search character to form the second long binary representation.

In one embodiment, the combining of the long binary representations corresponding to respective search characters includes combining the long binary representations with a bit-wise OR.

In one embodiment, the processing circuit is further configured to encode each of the set of search characters to form a respective short binary representation of the search character.

In one embodiment, the processing circuit is further configured to: evaluate a regular expression to generate the set of search characters.

BRIEF DESCRIPTION OF THE DRAWINGS

These and other features and advantages of the present invention will be appreciated and understood with reference to the specification, claims, and appended drawings wherein:

DETAILED DESCRIPTION

Figure 1:
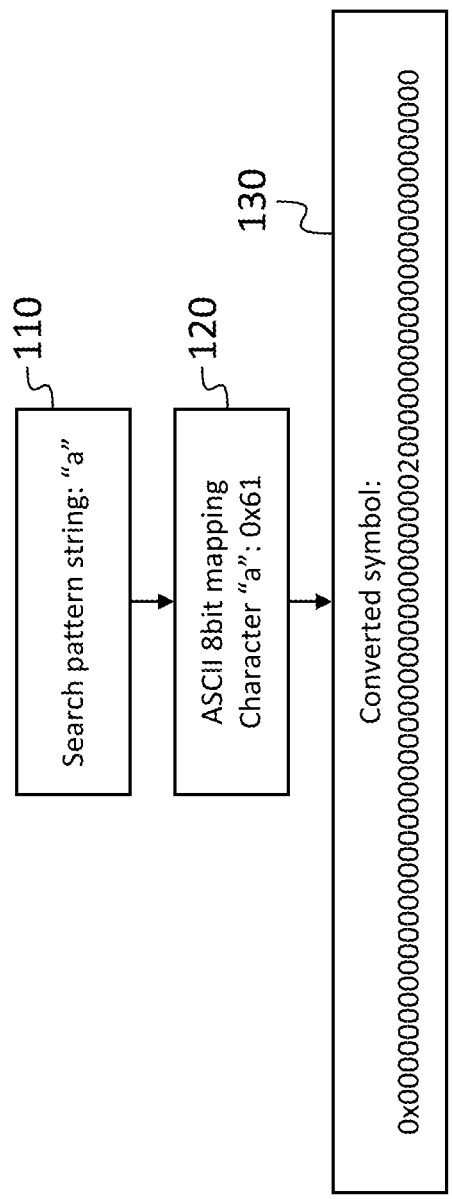
FIG. 1 is a flow chart of a method for encoding and converting a character, according to an embodiment of the present invention.

The detailed description set forth below in connection with the appended drawings is intended as a description of exemplary embodiments of a system and method for matching a combination of characters provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

In computer and machine-based telecommunications terminology, a character is a unit of information that may correspond to a grapheme, grapheme-like unit, or symbol, such as in an alphabet or syllabary in the written form of a natural language. Examples of characters include letters, numerical digits, common punctuation marks (such as "." or "-"), and whitespace. The concept of a character may also include control characters, which do not correspond to symbols in a particular natural language, but rather to other pieces of information used to process text in one or more languages. Examples of control characters include carriage return or tab, as well as instructions to printers or other devices that display or otherwise process text. Computers and communication equipment may represent characters using a character encoding that encodes each character to form a quantity—a sequence of binary digits (bits), for example (that may be referred to as a "binary representation" of the character)—that can be stored, or transmitted through a network. Two examples of character encodings are American Standard Code for Information Interchange (ASCII), and the Unicode Transformation Format using 8-bit blocks (UTF-8).

A text search may be executed by comparing the encoded value of each character in the set of search characters against the encoded value of each character in the search space. Regular expressions may make use of meta-characters to expand search capabilities. Each character in a regular expression is either understood to be a meta-character with its special meaning, or a regular character with its literal meaning. Together, they may be used to identify textual material of a given pattern. For example, the meta-character "." may match any single character. An expression formed by enclosing one or more characters in the meta-characters "[" and "]", referred to herein as a bracket expression, may match a single character from the search space (or "search space character") that is contained explicitly within the brackets; it may also match a single search space character that falls within a range in the bracket expression. For example, the bracket expression "[a-c]" may match any single letter from the collection "a", "b" and "c". In some embodiments, the present invention provides a hardware implementation to match any number of characters, contiguous or not in their representation, with a single comparator and concurrently.

In one example, referring to FIG. 1, the search pattern string may include (e.g., consist of) a single character, e.g., "a" as shown in block 110. This character may be encoded to form a short binary representation of the number, e.g., based on an encoding standard. Extended ASCII encoding may be used, for example, using 8 bits that can encode 256 different characters.

According to the encoding standard, every character may be represented by a unique, e.g., 8 bit, short binary representation. This short binary representation may be converted to another "long" binary representation, having a bit for each possible value of the short representation. The long binary representation may have a length of $2^n$ bits where n is the length of the short binary representation. For example, an 8 bit short binary representation may be converted to a 256 bit representation (or "symbol"), the latter having only one bit set, the position of the bit that is set corresponding to the value of the 8 bit short binary representation. For example, as illustrated in FIG. 1, the character "a" (110) is encoded, in an act 120, using ASCII encoding, to form a short (8bit) binary representation having the decimal value 97, or the hexadecimal value 61 (which may be written 0×61). The short binary representation may then be converted, in an act 130, to a long binary representation, which, for the character "a", may be a 256 bit binary number in which every bit value is binary 0 except the $97^{th}$ bit, which has a bit value of 1. The $97^{th}$ bit may be counted from the least significant bit, which may be identified as the $0^{th}$ bit; the $0^{th}$ may be the bit that is set when the short binary representation has a value of 0. The construction of the long binary representation may be performed as a software preprocessing procedure, e.g., it may be performed by a processing circuit (described in further detail below) executing a set of stored instructions.

Figure 2:
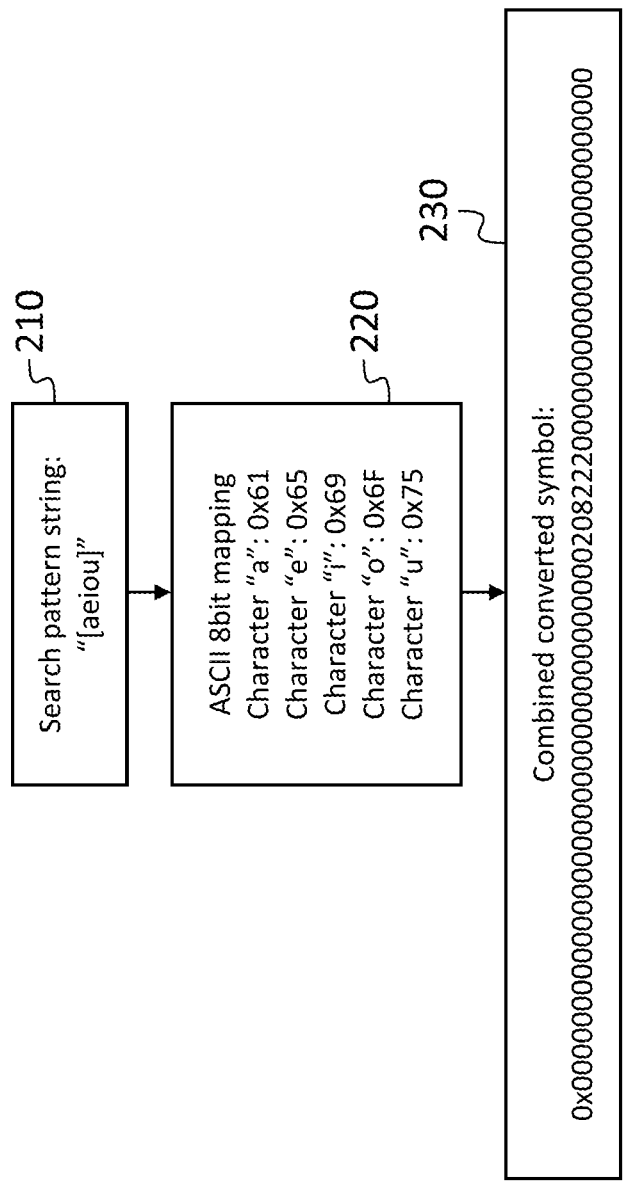
FIG. 2 is a flow chart of a method for encoding and converting a set of search characters, according to an embodiment of the present invention.

In another example, referring to FIG. 2, the search string may be "[aeiou]" which may be a regular expression that matches any of the characters "a", "e", "i", "o", and "u". To determine whether a character from the search space matches this expression, the following process may be employed. In an act 210, the system receives a regular expression, e.g., "[aeiou]", to be used in a search of the search space, and the system parses the regular expression to generate a set of search characters that correspond to the regular expression. In the case of the example of FIG. 2, the parsing may involve generating, from the regular expression "[aeiou]", the set of search characters "a", "e", "i", "o", and "u".

In an act 220, each of the characters in the set of search characters is encoded or "mapped" to a respective short binary representation, e.g., an 8-bit ASCII representation as shown. Finally, in an act 230, the system converts each short binary representation into a long binary representation, in which one bit is set to a value of binary 1 and the remaining bits each have a value of binary 0, and combines all of the long binary representations into a single combined long binary representation (or "symbol") representing the regular expression. The combining may involve performing a bit-wise OR operation, with all of the long binary representations corresponding to the characters in the set of search characters being input values to the bit-wise OR, with the result that the combined long binary representation (representing the regular expression) has a bit value of 1 at each bit position at which any of the long binary representations representing characters in the set of search characters has a bit value of 1. In some embodiments the long binary representation is formed by raising 2 to the power of the short binary representation, i.e., $L=2^s$ where L is the long binary representation, and S is the short binary representation.

In the example of FIG. 2, the five characters "a", "e", "i", "o", and "u" are mapped, in an ASCII representation, to short binary representations having (hexadecimal) values of 0×61, 0×65, 0×69, 0×6F, and 0×75, respectively. These short binary representations are then converted to long binary representations having values of $2^{0\times61}$, $2^{0\times65}$, $2^{0\times69}$, $2^{0\times6F}$, and $2^{0\times75}$, respectively, which, when combined using a bit-wise OR, result in the 256 bit number $2^{0\times61}$ OR $2^{0\times65}$ OR $2^{0\times69}$ OR $2^{0\times6F}$ OR $2^{0\times75}$=0x00000000000000000000000000000000208222000000000000000000000000.

This number can be seen from its hexadecimal representation, which is shown above and in FIG. 2, to include (e.g., consist of) a number of bits having bit values of 0, and five bits (corresponding to "a", "e", "i", "o", and "u") having bit values of 1. As may be seen from this example, because each bit position of the long binary representation corresponds to a possible value of the short binary representation, the long binary representations representing characters in the set of search characters may be combined to form a long binary representation in which one bit is set (e.g., set to a value of binary 1) for each of the characters in the set of search characters.

Figure 3:
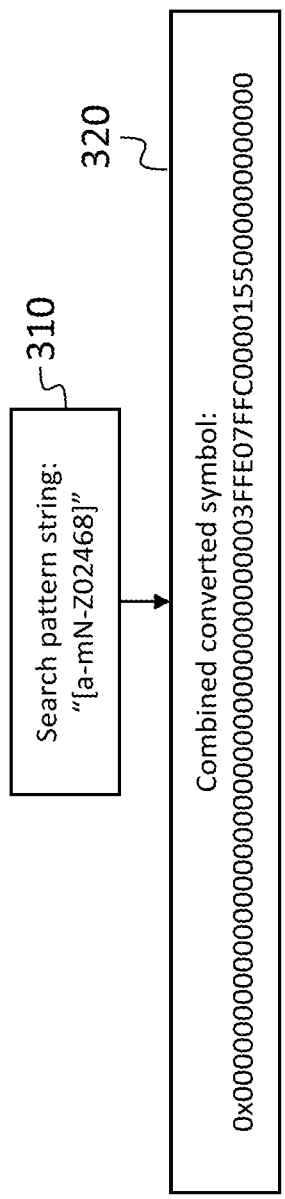
FIG. 3 is a flow chart of a method for encoding and converting a set of search characters, according to an embodiment of the present invention.

Referring to FIG. 3, in another example, the search pattern, received by the system in an act 310, is the regular expression "[a-mN-Z02468]". Accordingly a search space character will match the expression if it is a lowercase letter between "a" and "m", an uppercase letter between "N" and "Z" or an even digit. When each of the characters of the set of all characters meeting any of these constraints is mapped to a short binary representation and then converted to a long binary representation (by raising 2 to the power of the short binary representation), and when the long binary representations are combined, in an act 320, with a bit-wise OR, the result is 256-bit number with the following (hexadecimal) value:

0x00000000000000000000000000000000003FFE07FFC0000155000000000000.

As in the example of FIG. 2, this long binary representation has a bit value of 1 at each bit position corresponding to one of the characters in the set of search characters corresponding to the search string. Accordingly, if the short binary representation of a search space character is converted to a long binary representation (having a value of 1 at one bit position) by the same process (e.g., by raising 2 to the power of the short binary representation) then if, at the bit position at which the long binary representation of the search space character has a value of binary 1, the long binary representation corresponding to the search string also has a bit value of binary 1, it may be concluded that the search space character matches one of the set of search characters.

Figure 4:
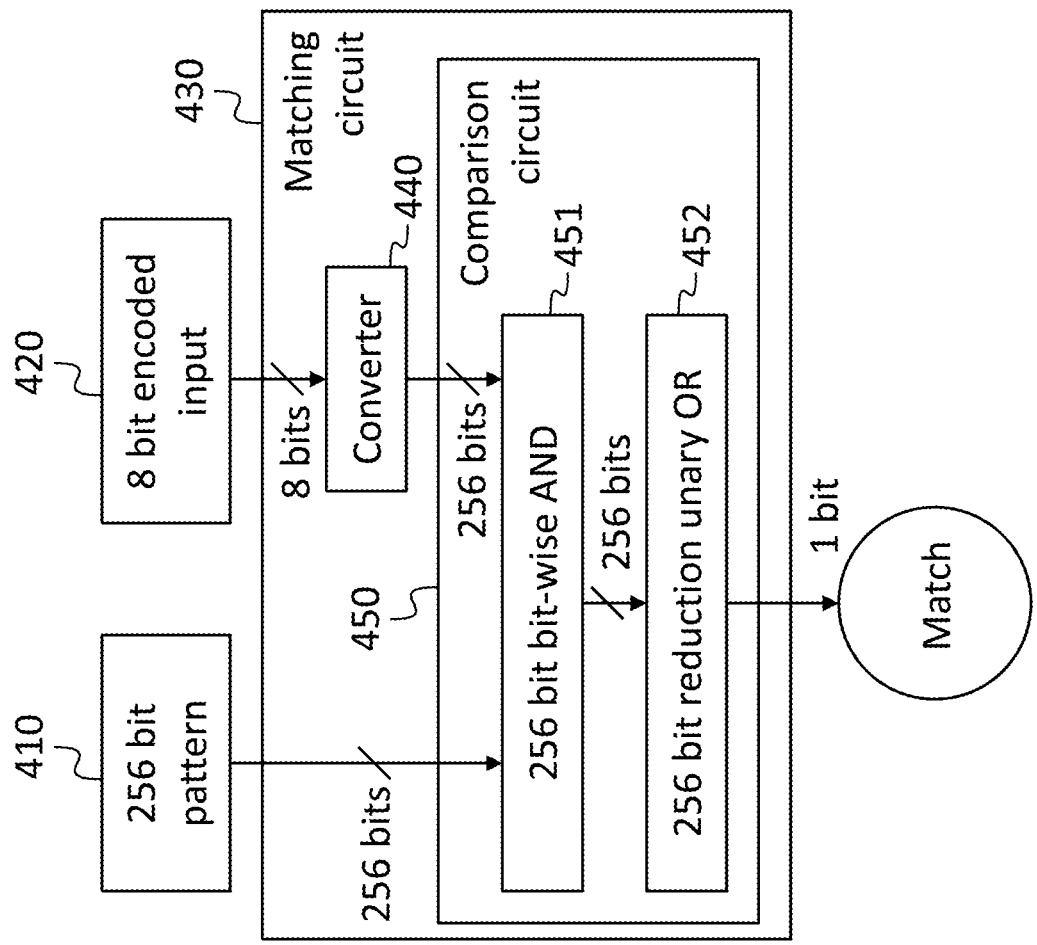
FIG. 4 is a block diagram of a system for comparing a character from a search space concurrently or simultaneously to each of a set of search characters, according to an embodiment of the present invention.

Referring to FIG. 4, in one embodiment, a long binary representation 410 representing a regular expression (e.g., a bracket expression) may be separately generated (e.g., by a processing circuit—not shown in FIG. 4—executing instructions, e.g., instructions stored in memory), and sent to the multiple character matching circuit 430. The multiple character matching circuit 430 may also receive, as a second input, a short binary representation 420 representing a search space character. The multiple character matching circuit 430 may then determine whether the search space character matches the long binary representation 410 representing the regular expression. To make this determination, the multiple character matching circuit 430 may include a converter (or "representation converter") 440 for converting from a short binary representation to a corresponding long binary representation, and a comparison circuit 450 for determining whether the search space character matches the regular expression. The multiple character matching circuit 430 may include a bit-wise AND gate 451 having first bus input, a second bus input, and a bus output; and a unary OR gate 452, having a bus input, and a single bit output. As used herein, a "bus input" is an input for receiving a plurality of signals, e.g., signals carried on a bus, in parallel. Similarly, a "bus output" is an output for producing a plurality of signals, e.g., signals carried on a bus, in parallel.

In operation, in one embodiment, the multiple character matching circuit 430 receives as input a long binary representation 410 representing the regular expression, and a short binary representation 420 representing a search space character. The long binary representation 410 representing the regular expression is fed to the comparison circuit 450, in which it is fed into a first input bus of the bit-wise AND gate 451.

The representation converter 440 converts the short binary representation 420 representing a search space character into a long binary representation representing the search space character. The representation converter may be a circuit implementing the following Verilog code, for example:

```
1  module char_mask
2  (
3    input character_t character,
4    output pattern_t mask
5  );
6
7  always_comb begin
8    mask.value = 256'h0;
9    mask.value[character] = 1'b1;
10  end
11
12 endmodule
```

The long binary representation representing the search space character may also be fed to the comparison circuit 450, in which it is fed into the second input bus of the bit-wise AND gate 451. This long binary representation, at the second input bus of the bit-wise AND gate 451, has a single bit set to a value of binary 1, at the position corresponding to the search space character. The bit-wise AND gate 451 performs an AND operation of each bit of its first bus input with a corresponding bit at its second bus input, to form a bit of its bus output. Accordingly, if, at the first input, in the position corresponding to the search space character, the bit-wise AND gate 451 receives a value of binary 1, then one bit of its output bus (the bit at this bit position) is has a value of binary 1; this occurs if the set of search characters corresponding to the regular expression includes the same character as the search space character; otherwise the values of the output bus are all binary 0. The unary OR gate 452 generates a value of binary 1 at its output if and only if at least one of its inputs has a value of binary 1; in this manner, it outputs a value of binary 1 if and only if one of the values of the output bus is a binary 1, which occurs if and only if the search space character matches one of the set of search characters.

In some embodiments, 8-bit encoding, e.g., ASCII, may be used, so that each short binary representation may have 256 different binary values. In such an embodiment, each long binary representation may be 256 bits long (i.e., $2^8$ bits long).

Figure 5:
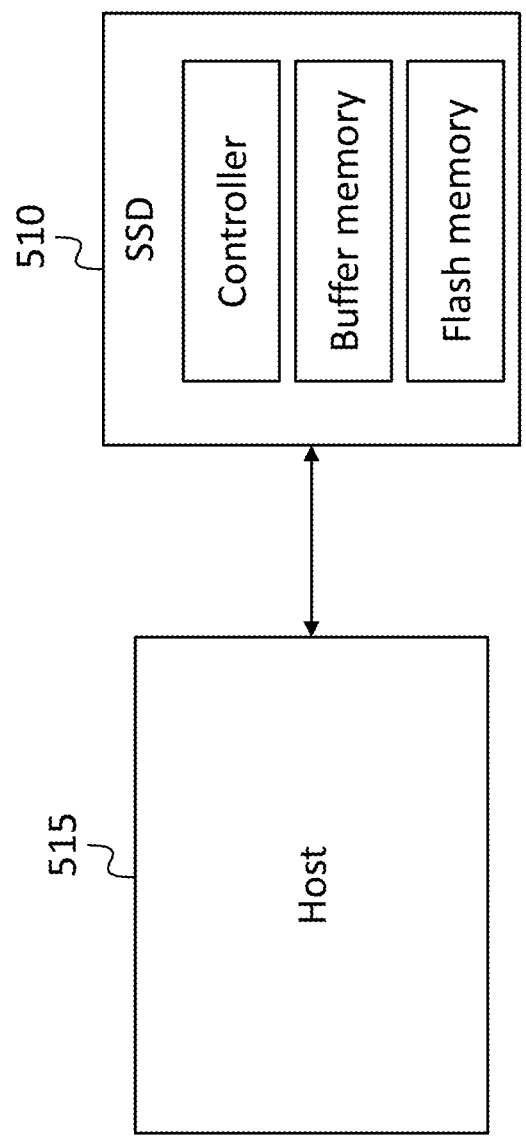
FIG. 5 is a block diagram of a solid state drive connected to a host, according to an embodiment of the present invention.

Referring to FIG. 5, in some embodiments a solid state drive 510 may, in operation, be connected to, and provide storage for, a host 515, e.g., a server or other computer. The host interface (including the host connector, and the communications protocols) between the solid state drive 510 and the host may be, for example, a storage interface such as Serial Advanced Technology Attachment (SATA), Fibre Channel, Small Computer System Interface (SCSI), Serial Attached SCSI (SAS), Peripheral Component Interconnect Express (PCIe), Non Volatile Memory Express (NVMe), SCSI over PCIe, or a more general-purpose interface such as Ethernet or Universal Serial Bus (USB). In some embodiments, the solid state drive 510 may conform to a 3.5 inch hard drive form-factor (or "large form factor" (LFF)) standard, or it may conform to a 2.5 inch hard drive form-factor (or small form factor (SFF)) standard. In other embodiments the solid state drive 510 may conform to a standard PCIe card form factor, e.g., a full-height, full length (FH-FL) card outline, or a full-height, half length (FH-HL) outline. The solid state drive 510 may include a controller, buffer memory, and flash memory.

A special-purpose processing circuit may implement the multiple character matching circuit 430 in the solid state drive 510. This special-purpose processing circuit may be part of an integrated circuit that is a system on a chip in the solid state drive 510, and the controller may be a part of the same system on a chip. The special-purpose processing circuit may be part of a synchronous digital circuit and the multiple character matching circuit 430 may consist entirely of gates (i.e., flip flops may be absent) so that the result, i.e., a logic value indicating whether or not the short binary representation present at the search character input of the multiple character matching circuit 430 matches any of the set of search characters represented by the long binary representation at the other input of the multiple character matching circuit 430, may be obtained within one clock cycle. In some embodiments the multiple character matching circuit 430 is part of the host 515, or part of another computer, or it is, or is part of, a separate piece of hardware, e.g., it may be part of a hard disk drive.

In some embodiments, the act of encoding the characters may be performed separately, e.g., before characters are stored in the search space, which may be a region of memory or of persistent storage, such as a hard disk drive or a solid state drive. In some embodiments, instead of being equal to 2 raised to the power of the short binary representation (i.e., the position of the bit set to a value of binary 1 being counted from the least significant bit), the long binary representation may be formed by setting a bit the position of which is counted from the most significant bit, i.e., $L=2^n/2^S$ where L is the long binary representation, S is the short binary representation, and n is the number of bits in the short binary representation. In some embodiments the long binary representation for any character is a binary number every bit except one of which is set to a value of binary 1, the one bit set to a value of binary 0 being at a position corresponding to the character. In such an embodiment, a bit-wise NOR gate may be used instead of a bit-wise AND gate 451 in the multiple character matching circuit 430.

In other embodiments a different mapping is used, and in general any mapping from short binary representation to the long binary representation may be used as long as the same mapping is used for the search space character and for each of the set of search characters corresponding to the regular expression, and as long as the mapping has the characteristic that for each character to be compared, there is a bit position in the long binary representation that is set to a first binary value (i.e., to 0 or to 1) for that character, and that for every other character is set to the other binary value (i.e., to 1 or to 0, respectively). In some embodiments the conversion operations for the search space character and for each of the set of search characters corresponding to the regular expression are complementary; e.g., one conversion produces a binary number that has a zero at every bit position except one, and the other produces a binary number that has a one at every bit position except one. In such an embodiment, the bit-wise AND gate 451 of the multiple character matching circuit 430 may have one bus input inverted.

In some embodiments the length of the long binary representation is greater or less than $2^n$ bits. For example, if it is known in advance that all of the characters in the search space, and in any regular expression to be searched for, are (i) either uppercase or lowercase characters of the Latin alphabet, (ii) digits, or (iii) the space character (" "), then the long binary representation may have as few as 63 bits. If the regular expression is known in advance of building the comparison circuit 450, then bit-wise AND gate 451 may be omitted from the comparison circuit 450, which may instead have a plurality of wires, each corresponding to one set bit of the long binary representation corresponding to the regular expression, each connected from an output bit of the representation converter 440 to the unary OR gate 452.

In light of the foregoing, some embodiments of the present invention provide a system and method for efficiently comparing a search space character to a set of search characters, the set corresponding for example to characters that match a regular expression specified in a search string. In one embodiment, each character of the set of search characters is represented as a short binary representation (e.g., ASCII) which is transformed into a long binary representation, the long binary representation having one bit for each possible value of the short binary representation. In the long binary representation, each bit may be set to zero except for one bit, the one bit being at a position corresponding to the value of the short binary representation. The long binary representations may be ORed together to form a combined long binary representation corresponding to the set of search characters. The search space character may also be mapped to a short binary representation, which may also be converted to a long binary representation for the search space character. If the bit that is set in the long binary representation for the search space character is in the same position as any set bit in the long binary representation for the set of search characters, then the search space character matches one of the set of search characters. Accordingly, whether there is such a match may be assessed by performing a bit-wise AND of the long binary representation for the search space character and the long binary representation for the set of search characters, and performing a unary OR of the resulting set of bits.

The term "processing circuit" is used herein to include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PWBs. A processing circuit may contain other processing circuits; for example a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for matching a combination of characters have been specifically described and illustrated herein, many modifications and variations will be apparent to those skilled in the art. Accordingly, it is to be understood that a system and method for matching a combination of characters constructed according to principles of this invention may be embodied other than as specifically described herein. The invention is also defined in the following claims, and equivalents thereof.

What is claimed is:

1. A method for comparing a search space character to a set of search characters to determine whether the search space character matches any character in the set of search characters, the method comprising:
converting a first short binary representation of the search space character into a first long binary representation, the first long binary representation having a first bit value in a first position within the first long binary representation;
converting a short binary representation of a first search character of the set of search characters into a second long binary representation; and
determining that the search space character matches the first search character when a bit in the first position of the second long binary representation has a second bit value.

2. The method of claim 1, wherein the first bit value is a value of binary 1 and the second bit value is a value of binary 1.

3. The method of claim 1, wherein:
the first long binary representation equals $2^{S1}$, wherein S1 is the value of the first short binary representation; and
the second long binary representation equals $2^{S2}$, wherein S2 is the value of the short binary representation of the first search character of the set of search characters.

4. The method of claim 1, further comprising:
converting a short binary representation of a second search character of the set of search characters into a third long binary representation; and
determining that the search space character matches either the first search character or the second search character when:
a bit in the first position of the second long binary representation has the second bit value; or
a bit in the first position of the third long binary representation has the second bit value.

5. The method of claim 1, comprising:
converting a respective short binary representation of each search character of the set of search characters to form a corresponding set of respective long binary representations including the second long binary representation, the second long binary representation having the second bit value at a third position, each of the long binary representations of the set of respective long binary representations except the second long binary representation having a third bit value different from the second bit value;
determining that the search space character matches one of the characters of the set of search characters when one of the long binary representations of the set of respective long binary representations has the second bit value at the first position; and
determining that the search space character does not match one of the characters of the set of search characters when none of the set of respective long binary representations has the second bit value at the first position.

6. The method of claim 1, wherein the first short binary representation has a length of n bits, and the first long binary representation has a length of $2^n$ bits.

7. The method of claim 6, wherein the first short binary representation has a length of 8 bits, and the first long binary representation has a length of 256 bits.

8. The method of claim 1, further comprising, before converting the first short binary representation of the search space character into the first long binary representation,
encoding a search space character to form the first short binary representation of the search space character.

9. The method of claim 8, wherein the encoding of the search space character comprises encoding the search space character with an American Standard Code for Information Interchange (ASCII) encoding.

10. The method of claim 1, wherein:
the converting of the first short binary representation of the search space character into a first long binary representation;
the converting of the short binary representation of the first search character of the set of search characters into the second long binary representation; and
the determining that the search space character matches the first search character when a bit in the first position of the second long binary representation has a second bit value, are performed in synchronous digital logic in one clock cycle.

11. A system comprising:
a converter configured to receive, at an input of the converter, a first value of a short binary representation corresponding to a search space character, and to convert the short binary representation to a first long binary representation corresponding to the search space character, the first long binary representation having a bit at a first position set to a first bit value, the first position corresponding to the first value of the short binary representation, the converter being configured to generate a long binary representation having the bit at the first position set to the first bit value only when the value at the input of the converter is the first value of the short binary representation;
a comparison circuit configured to receive at a first input the first long binary representation, and at a second input a second long binary representation, corresponding to a set of search characters, and to generate a binary output, the binary output having:
a binary value indicating that the search space character matches a search character when a bit at the first position in the second long binary representation has a second bit value; and
a binary value indicating that the search space character does not match a search character otherwise.

12. The system of claim 11, wherein the first bit value is a value of binary 1 and the second bit value is a value of binary 1.

13. The system of claim 11, wherein the comparison circuit comprises a bit-wise AND gate having a first bus input, a second bus input, and a bus output, the bit-wise AND gate being configured to set to a value of binary 1 each bit of the bus output for which the corresponding bit at the first bus input has a value of binary 1 and the corresponding bit at the second bus input has a value of binary 1, and to set the remaining bits of the bus output to a value of binary 0.

14. The system of claim 13, wherein:
the first long binary representation has a length of m bits, m being a positive integer;
the second long binary representation has a length of m bits;
the first bus input of the bit-wise AND gate has a width of m bits;
the second bus input of the bit-wise AND gate has a width of m bits; and
the bus output of the bit-wise AND gate has a width of m bits.

15. The system of claim 14, further comprising a unary OR gate having m inputs and one output, the m inputs of the unary OR gate being connected to respective bits of the bus output of the bit-wise AND gate, the unary OR gate being configured to set the output of the unary OR gate:
to a value of binary 1 when at least one of the m inputs is set to a value of binary 1; and
to a value of binary 1 when each of the m inputs is set to a value of binary 0.

16. The system of claim 13, wherein the short binary representation has a length of n bits, and $m=2^n$.

17. The system of claim 16 wherein the short binary representation has a length of 8 bits, and m=256.

18. The system of claim 11, further comprising a processing circuit configured to:
convert each of a plurality of short binary representations corresponding to respective search characters, to a corresponding long binary representation; and
combine the long binary representations corresponding to respective search character to form the second long binary representation.

19. The system of claim 18, wherein the combining of the long binary representations corresponding to respective search characters comprises combining the long binary representations with a bit-wise OR.

20. The system of claim 19, wherein the processing circuit is further configured to encode each of the set of search characters to form a respective short binary representation of the search character.

21. The system of claim 19, wherein the processing circuit is further configured to:
evaluate a regular expression to generate the set of search characters.

* * * * *